United States Patent [19]

Campbell

[11] 4,267,600
[45] May 12, 1981

[54] MODULATION MONITORING APPARATUS

[75] Inventor: Kenneth J. Campbell, Solana Beach, Calif.

[73] Assignee: The United States of America as represented by the Secretary of the Navy, Washington, D.C.

[21] Appl. No.: 101,029

[22] Filed: Dec. 6, 1979

[51] Int. Cl.³ .............................................. H04B 1/02
[52] U.S. Cl. ...................... 455/115; 455/67; 324/77 B; 329/122
[58] Field of Search ............... 455/115, 67, 108, 113, 455/125, 265, 255, 257; 324/78 Z, 76 R, 77 R, 77 B, 118; 329/111, 122, 124, 129, 132, 136; 332/38, 39, 20

[56] References Cited

U.S. PATENT DOCUMENTS

| 3,105,193 | 9/1963 | Denton | 324/82 |
| 3,537,009 | 10/1970 | Brooks | 455/115 |
| 3,649,909 | 3/1972 | Ort | 455/115 |
| 3,736,510 | 5/1973 | Wu | 455/115 |
| 3,992,670 | 11/1976 | Gittins | 455/121 |

*Primary Examiner*—Robert L. Griffin
*Assistant Examiner*—Tommy P. Chin
*Attorney, Agent, or Firm*—Richard S. Sciascia; Ervin F. Johnston; Thomas M. Phillips

[57] ABSTRACT

An apparatus is described for converting the carrier frequency of a modulated signal sampled from the output of an RF transmitter. The conversion provides a replica of the modulated signal at a predetermined center frequency without regard to the selection of a transmitter channel or to the modulation technique used. The replica is presented to a demodulator which provides an information signal suitable for monitoring the quality of modulation of the transmitted signal.

6 Claims, 1 Drawing Figure

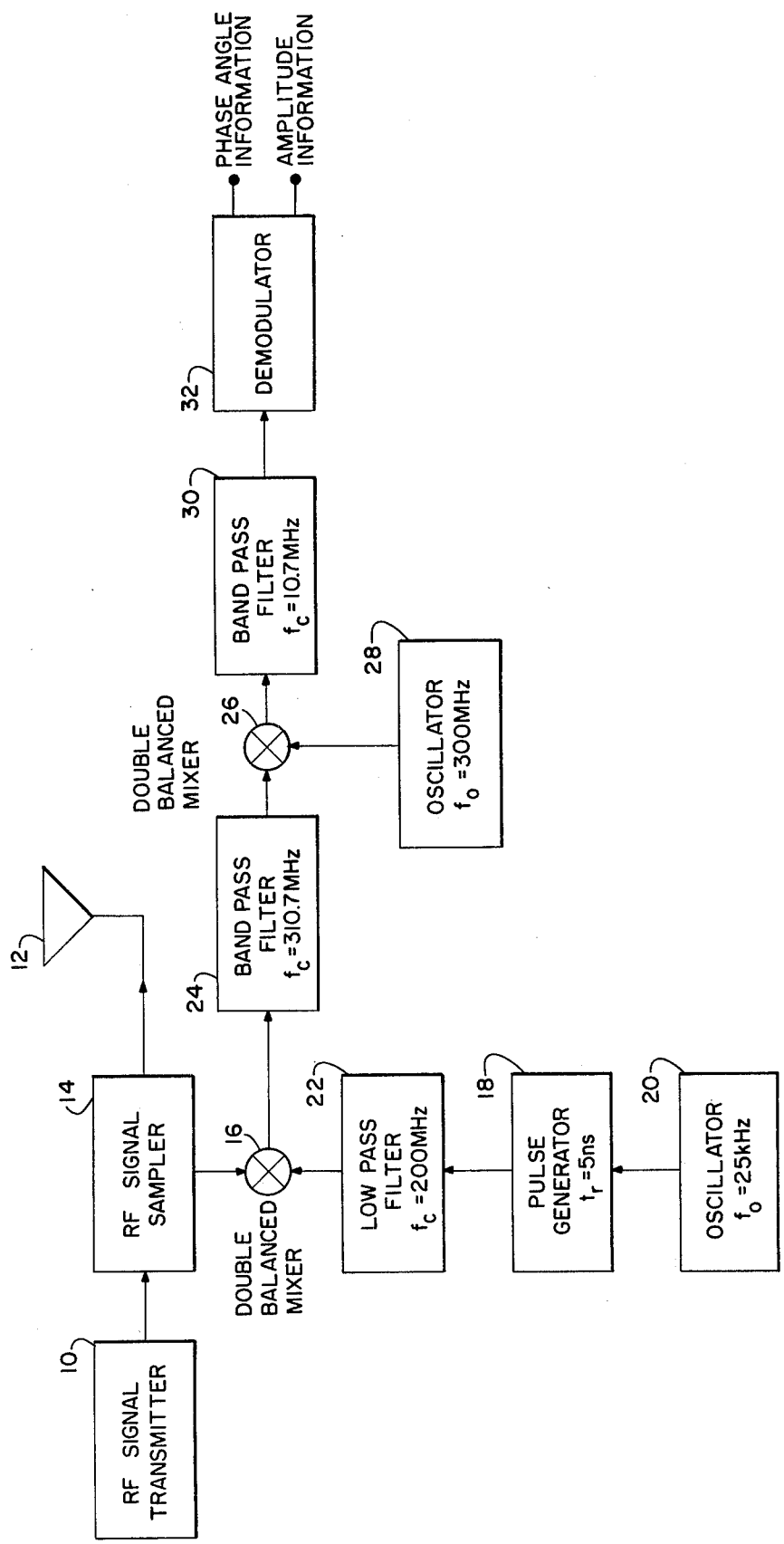

MODULATION MONITORING APPARATUS

BACKGROUND OF THE INVENTION

The present invention relates to components of radio frequency transmitter monitoring apparatus. More particularly, it relates to a frequency converter for use in a radio frequency transmitter monitoring apparatus which provides the monitoring apparatus with the capability to evaluate transmitter signals without regard to the selected channel. The present means of evaluating these types of transmitted signals require test set adjustment to follow changes of transmitter channel frequency. A need exists for an apparatus which can provide a signal for continuous monitoring of modulation quality without requiring adjustment to follow changes in the transmitter channel.

SUMMARY OF THE INVENTION

The present invention provides for a simple, effective apparatus for obtaining a replica of a modulated signal from a radio transmitter, the replica being confined by the apparatus to a single, predetermined center frequency for any selected raio channel frequency. The RF signal output of a transmitter is sampled and combined with a first reference signal with a pulse repetition rate equal to the channel spacing of the RF signal transmitter. The output signal is filtered and combined with a second reference signal to provide an intermediate frequency signal which is fed to a demodulator capable of demodulating AM, FM, SFK, or PSK signals. The demodulator output can be used to monitor the quality of modulation of the radio transmission signal.

OBJECTS OF THE INVENTION

An object of the invention is the provision of an apparatus for monitoring the modulated RF output of a transmitter without regard to the channel frequency.

A further object of the invention is the provision of an apparatus for monitoring the modulated RF output of a transmitter without regard to the channel frequency that requires no tuning to track the transmitted RF signal frequency.

Another object of the invention is the provision of an apparatus for monitoring the modulated RF output of a transmitter that is highly suited to automatic test applications.

A further object of the invention is the provision of an apparatus for monitoring an RF signal having many different types of modulation formats.

Another object of the invention is the provision of an apparatus for monitoring the modulated RF output of a transmitter without the need for complex test equipment and has the attendant advantage of reduction in the skill level required of the technician.

Other objects and many of the attendant advantages of this invention will be readily appreciated as the same becomes better understood by reference to the following detailed description when considered in connection with the accompanying drawings wherein there is shown in the single FIGURE a block diagram of the preferred embodiment of the invention.

DESCRIPTION OF THE PREFERRED EMBODIMENT

With reference now to the drawings, there is shown a RF signal transmitter 10 whose modulation quality and adequacy is to be evaluated. By way of example and explanation, transmitter 10 may be the transmitter portion of the AN/WSC-3 radio set and is capable of transmitting on any channel in the 225 MHz to 400 MHz frequency range with channels spaced at 25 KHz. Transmitter 10 also is capable of AM, FM, FSK, or PSK operation. The output RF signal from transmitter 10 is fed to transmitting antenna 12 through RF signal sampler 14 which may be of the ZSC-2-1 type manufactured by Mini-Circuits Laboratory. RF signal sampler 14 couples a small portion of the RF energy out of transmitter 10 as one input to double-balanced mixer 16. The remainder of the RF signal energy is fed to transmitting antenna 12. Coupled as a second input to double-balanced mixer 16 is a pulse signal generated by pulse generator 18 at a pulse repetition rate determined by the frequency of oscillator 20. The width of the rectangular pulses is determined by the width of the frequency band in which the transmitter 10 operates. A rule of thumb is $t_r = 1/\text{bandwidth}$. In the example chosen, the pulse repetition frequency (PRF) of oscillator 20 is 25 KHz, equivalent to the channel spacing of transmitter 10. The output from pulse generator 18 is fed through a low-pass filter 22 with a cutoff frequency of 200 MHz. Then the pulsed signal fed to mixer 16 will have all frequency components above 200 MHz attenuated.

The output of double-balanced mixer 16, which will contain all the sum and difference components of the two signals being added, is fed to a band-pass filter 24 which is designed to pass only those frequencies in the neighborhood of 310.7 MHz while highly attenuating all others. The output from filter 24 is fed as a first input to a second double-balanced mixer 26. Double-balanced mixers 16 and 26 may be of the ZAD-1W manufactured by Mini-Circuits Laboratory. The second input to mixer 26 is a 300 MHz signal supplied by oscillator 28.

The output from mixer 26 is fed to a band-pass filter 30 designed to pass only frequencies within 10 KHz of the band-pass center frequency of 10.7 MHz. All other frequencies are highly attenuated. The signal passed by band-pass filter 30 is coupled to a demodulator 32 which is capable of demodulating AM, FM, FSK, or PSK signals with the 10.7 MHz intermediate frequency signal. Demodulator 32 may be of the NE561 type manufactured by Signetics.

In operation, the signal from RF signal transmitter 10 is fed through RF signal sampler 14 to antenna 12, where the energy is radiated. Because only a small amount of energy is necessary for use by the modulation analysis circuitry, the attenuation effect of the RF signal sampler 14 on the transmitted RF signal is negligible, and signal sampler 14 may be permanently left in the transmission line without any adverse effects. The RF signal sample from signal sampler 14 is fed to double-balanced mixer 16 where it is mixed with a pulse signal provided by low-pass filter 22.

Oscillator 20 operates at a frequency equal to the channel spacing of the RF signal transmitter 10, 25 KHz in the example. The output of oscillator 20 triggers pulse generator 18. Pulse generator 18 then generates pulses 5 nanoseconds wide at a 25 KHz repetition rate. These pulses are fed to low-pass filter 22 where all frequency components above 200 MHz are highly attenuated. The purpose of this filter is to eliminate unwanted frequency products which would otherwise appear in the output of double-balanced mixer 16.

With this circuit structure, any channel selected on transmitter 10 will cause double-balanced mixer 16 to produce mixing products which are sums or differences of that channel frequency and each line of the spectrum of the 5 ns pulse. The pulse spectrum consists of frequency components at each multiple of the channel frequency distance from 25 KHz to 200 MHz, the cutoff of filter 22. For each channel from, in the example, 225 MHz to 400 MHz there will be one line in the pulse spectrum which, together with the channel, will produce a sum or difference product at 310.7 MHz. Changing the channel will not eliminate a product at this frequency. Hence, for each the channel selection transmitter 10, a mixing product will be produced at 310.7 MHz; if the channel is modulated, a replica of the modulation envelope will be carried at 310.7 MHz at the output of mixer 16. There will also be many other mixing products generated.

To filter out undesired mixing products, the output of double-balanced mixer 16 is fed to band-pass filter 24. This filter is designed to pass only those frequency products in the range 310.7 MHz±20 MHz, while highly attenuating all others. The 310.7 MHz intermediate frequency, carrying a replica of the transmitted signal, is fed to double-balanced mixer 26 where it is mixed with a 300 MHz signal provided by oscillator 28. The output of double-balanced mixer 26 contains the desired mixing product at 10.7 MHz which now bears the replica of the transmitted signal. The 10.7 MHz frequency is chosen because it is the common IF frequency and would be compatible with available equipment.

Again unwanted mixing products are also present. Removal of these undesired products is accomplished by band-pass filter 30. This filter passes only signals in the range 10.7 MHz±25 MHz while highly attenuating all other frequencies. The output of band-pass filter 30, still bearing the replica of the transmitted signal, is fed to demodulator 32 where the signal is demodulated. The demodulated output provides a test input signal from which the quality and amount of modulation of the transmitted signal can be derived with the appropriate test equipment.

If FM, FSK, or PSK is being transmitted, the phase angle information output signal from demodulator 32 would be used. If AM is being transmitted, the amplitude information signal would be used. By using standard analysis techniques, i.e., a peak to peak detector to determine maximum frequency derivation, a low-pass filter to provide average frequency or the amplitude of the demodulated AM signal would indicate the modulation percentage. Other important modulation parameters such as total harmonic distortion, phase shift, etc., may be similarly evaluated.

Obviously, many other modifications and variations of the present invention are possible in the light of the above teachings. It is therefore to be understood that within the scope of the appended claims the invention may be practiced otherwise than as specifically described.

What is claimed is:

1. Monitoring apparatus for generating an output signal useful for evaluating the modulation quality and adequacy of an RF signal from a transmitter having a plurality of equally spaced channels, without regard to the selection of a channel, comprising:

first combining means for combining said RF signal with a first reference signal having a PRF equal to the transmitter channel spacing to produce a first signal of a predetermined frequency, second combining means coupled to said first combining means for combining said first signal with a second reference signal to produce a second signal of a predetermined frequency, and demodulating means coupled to said second combining means to produce said output signal having components proportional to the modulation of the transmitted RF signal.

2. The monitoring apparatus of claim 1 wherein said first reference signal is provided by a pulse generator triggered by an oscillator tuned to the transmitter channel spacing.

3. The monitoring apparatus of claim 1 wherein said first predetermined frequency signal is obtained by passing the output of said first combining means through a first band-pass filter tuned to pass signals of said first predetermined frequency.

4. The monitoring apparatus of claim 3 wherein the frequency of said second reference signal is provided by an oscillator tuned to a frequency near the frequency to which said first band-pass filter is tuned.

5. The monitoring apparatus of claim 4 wherein the output of said second combining means is coupled to a band-pass filter tuned to the predetermined frequency of said second signal.

6. The monitoring apparatus of claim 5 wherein the value of said first and second references frequencies and the band-passes of said filters are such that the frequency of said second predetermined signal is 10.7 MHz.

* * * * *